United States Patent
Cheng et al.

(10) Patent No.: US 9,965,003 B2
(45) Date of Patent: May 8, 2018

(54) ELECTRONIC ASSEMBLY AND ELECTRONIC DEVICE

(71) Applicant: HTC Corporation, Taoyuan (TW)

(72) Inventors: Ying-Yen Cheng, Taoyuan (TW); Ya-Lin Hsiao, Taoyuan (TW)

(73) Assignee: HTC Corporation, Taoyuan (TW)

( * ) Notice: Subject to any disclaimer, the term of this patent is extended or adjusted under 35 U.S.C. 154(b) by 0 days. days.

(21) Appl. No.: 14/794,824

(22) Filed: Jul. 9, 2015

(65) Prior Publication Data

US 2017/0010642 A1    Jan. 12, 2017

(51) Int. Cl.
G06F 1/20 (2006.01)
H05K 5/00 (2006.01)
H05K 7/20 (2006.01)

(52) U.S. Cl.
CPC ........... *G06F 1/20* (2013.01); *H05K 7/20336* (2013.01)

(58) Field of Classification Search
CPC .... H05K 7/2039; H05K 1/0203; H05K 1/181; H05K 1/0204; H05K 1/0206; H05K 1/111; H05K 7/20281; H05K 7/20327; H05K 1/117; H05K 7/20336; H05K 7/209

See application file for complete search history.

(56) References Cited

U.S. PATENT DOCUMENTS

| | | | | |
|---|---|---|---|---|
| 5,355,942 A | * | 10/1994 | Conte | ................. F28D 15/0233 165/104.33 |
| 5,647,429 A | * | 7/1997 | Oktay | ................. F28D 15/0275 165/104.14 |
| 5,842,514 A | * | 12/1998 | Zapach | ................. H01L 23/427 165/104.33 |
| 6,308,524 B1 | | 10/2001 | Mochizuki et al. | |

(Continued)

FOREIGN PATENT DOCUMENTS

CN    2715223    8/2005
CN    103929935    7/2014

(Continued)

OTHER PUBLICATIONS

"Office Action of Taiwan Counterpart Application", dated Oct. 24, 2016, p. 1-p. 5, in which the listed references were cited.

(Continued)

*Primary Examiner* — James Wu
*Assistant Examiner* — Michael Matey
(74) *Attorney, Agent, or Firm* — JCIPRNET

(57) ABSTRACT

An electronic assembly including a circuit board, a heat-generating element, and a heat pipe is provided. The heat-generating element includes a bottom surface and a side surface connected to the bottom surface. The heat-generating element is mounted on the circuit board via the bottom surface. The heat pipe is thermally coupled to the side surface of the heat-generating element to absorb heat from the heat-generating element. Additionally, an electronic (Continued)

device includes a casing, a display, and the above-described electronic assembly. The display is mounted on the casing. The electronic assembly is disposed in the casing. The heat-generating element is mounted on the circuit board and its side surface is thermally coupled to the heat pipe. As a result, the limitation on the thickness of the heat pipe is relaxed, thereby allowing the efficiency of the heat pipe to be increased.

18 Claims, 4 Drawing Sheets

(56) References Cited

U.S. PATENT DOCUMENTS

| Patent/Pub No. | Kind | Date | Inventor | Classification |
|---|---|---|---|---|
| 6,333,850 | B1* | 12/2001 | Pei | G06F 1/20 174/15.2 |
| 6,341,062 | B1* | 1/2002 | Patel | G06F 1/203 165/104.21 |
| 6,570,761 | B2 | 5/2003 | Stone et al. | |
| 6,840,310 | B2* | 1/2005 | Tonosaki | F28D 15/0266 165/104.21 |
| 6,873,525 | B2* | 3/2005 | Minamitani | F28D 15/0266 165/104.21 |
| 7,007,746 | B2* | 3/2006 | Wu | F28D 15/043 165/104.26 |
| 7,250,576 | B2* | 7/2007 | Colgan | H01L 23/04 174/252 |
| 7,277,286 | B2* | 10/2007 | Lee | G06F 1/20 174/15.2 |
| 7,921,663 | B2* | 4/2011 | Ueno | F28D 15/0275 165/104.33 |
| 8,061,412 | B2* | 11/2011 | Ippoushi | H01L 23/473 165/185 |
| 8,462,509 | B2* | 6/2013 | Hsieh | H05K 7/205 361/720 |
| 9,041,192 | B2* | 5/2015 | Saeidi | H01L 23/16 257/675 |
| 9,353,995 | B2* | 5/2016 | Wu | H01L 23/473 |
| 9,362,202 | B2* | 6/2016 | Baba | H05K 1/0272 |
| 9,405,335 | B1* | 8/2016 | Boilard | G06F 1/20 |
| 2004/0080908 | A1* | 4/2004 | Wang | G06F 1/203 361/679.47 |
| 2006/0096740 | A1* | 5/2006 | Zheng | F28D 15/0233 165/104.26 |
| 2006/0151153 | A1* | 7/2006 | Chen | F28D 15/02 165/104.26 |
| 2006/0158855 | A1* | 7/2006 | Wilson | H01L 23/3677 361/707 |
| 2006/0238980 | A1* | 10/2006 | Bhattacharyya | H05K 7/20145 361/700 |
| 2009/0108439 | A1* | 4/2009 | Brandenburg | H01L 23/473 257/714 |
| 2009/0178425 | A1* | 7/2009 | Tsuchiya | G06F 1/203 62/259.2 |
| 2009/0225515 | A1* | 9/2009 | Hom | H05K 7/20781 361/701 |
| 2009/0231881 | A1* | 9/2009 | Shibata | G02F 1/133603 362/612 |
| 2010/0212331 | A1* | 8/2010 | Critser | A01N 1/02 62/51.1 |
| 2011/0073284 | A1* | 3/2011 | Yoo | F28D 15/0266 165/104.26 |
| 2011/0139329 | A1* | 6/2011 | Clayton | H05K 1/189 156/53 |
| 2011/0292608 | A1* | 12/2011 | Tan | H01L 23/36 361/696 |
| 2012/0069526 | A1* | 3/2012 | Tissot | H05K 7/20809 361/720 |
| 2012/0267078 | A1* | 10/2012 | Wu | H01L 23/427 165/104.26 |
| 2013/0039072 | A1* | 2/2013 | Kim | F21V 29/006 362/294 |
| 2013/0120926 | A1* | 5/2013 | Barina | H01L 23/4093 361/679.32 |
| 2013/0279232 | A1* | 10/2013 | Sharette | H01L 23/36 365/51 |
| 2013/0312939 | A1* | 11/2013 | Uchida | F28D 15/04 165/104.26 |
| 2014/0015106 | A1 | 1/2014 | Hsieh et al. | |
| 2014/0192480 | A1* | 7/2014 | Winkler | G06F 1/203 361/679.47 |
| 2014/0262161 | A1* | 9/2014 | Weigand | G06F 1/203 165/104.33 |
| 2014/0340841 | A1* | 11/2014 | Yu | G06F 1/203 361/679.47 |
| 2015/0085442 | A1* | 3/2015 | Kondo | G06F 1/20 361/679.54 |
| 2015/0119111 | A1* | 4/2015 | Honmura | G06F 1/203 455/566 |
| 2015/0138731 | A1* | 5/2015 | Mann | H05K 7/20336 361/700 |
| 2015/0181764 | A1* | 6/2015 | Honmura | H05K 7/20336 165/104.26 |
| 2015/0216081 | A1* | 7/2015 | Huang | H05K 7/20445 165/104.21 |
| 2015/0216082 | A1* | 7/2015 | Huang | H05K 7/20336 165/104.21 |
| 2015/0350392 | A1* | 12/2015 | Park | H04M 1/0202 455/575.6 |
| 2015/0382448 | A1* | 12/2015 | Pennathur | H05K 1/0203 361/679.54 |
| 2016/0021786 | A1* | 1/2016 | Hata | G06F 1/203 361/700 |
| 2016/0095197 | A1* | 3/2016 | Lee | H05K 1/0272 361/700 |
| 2016/0282914 | A1* | 9/2016 | Saito | H05K 7/20336 |
| 2016/0295743 | A1* | 10/2016 | Yu | H05K 7/20809 |
| 2017/0034949 | A1* | 2/2017 | Yokoi | H05K 7/20254 |

FOREIGN PATENT DOCUMENTS

| | | |
|---|---|---|
| TW | 200423859 | 11/2004 |
| TW | 201118545 | 6/2011 |

OTHER PUBLICATIONS

"Office Action of China Counterpart Application," dated Feb. 14, 2018, p. 1-p. 7, in which the listed references were cited.

* cited by examiner

ELECTRONIC ASSEMBLY AND ELECTRONIC DEVICE

FIELD OF THE APPLICATION

The application relates to an electronic assembly and an electronic device, and more particularly, to an electronic assembly and an electronic device with heat dissipation function.

DESCRIPTION OF RELATED ART

Due to multi-function and miniaturization designs such as smart phones and tablets and other electronic devices have become very popular. The electronic devices of this type are usually equipped with elements that emit heat, such as central processing units; therefore heat dissipation measures must be taken to lower the temperature of these heat-generating elements to ensure proper function of the elements.

FIG. 1 depicts a conventional electronic assembly. Referring to FIG. 1, an electronic assembly 10 is formed by a number of electronic elements inside a smart phone, including a circuit board 11, a central processing unit 12 (a heat-generating element), a shielding cover 13, and a heat pipe 14. The central processing unit 12 and the shielding cover 13 are mounted on the circuit board 11. The shielding cover 13 covers the central processing unit 12, and the top of the shielding cover 13 is thermally coupled to the top of the central processing unit 12 through a heat dissipation pad 15. The heat pipe 14 is also thermally coupled to the top of the shielding cover 13, such that the heat generated by the central processing unit 12 is transferred to the heat pipe 14 through the heat dissipation pad 15 and the shielding cover 13, and transferred through the heat pipe 14 to other places for heat dissipation.

Referring to FIG. 1 again, since the electronic assembly 10 applies a component stacked structure, as smart phones continue to decrease in thickness, the overall thickness of the electronic assembly 10 continues to decrease, thereby severely limiting the thickness of the heat pipe 14. In some designs, the thickness of the heat pipe 14 even needs to be less than 0. 5 mm, thereby decreasing the efficiency of the heat pipe 14. Similarly, since the electronic assembly 10 applies an element stacked structure, heat resistance of the central processing unit 12 occurs between the central processing unit 12 and the heat dissipation pad 15, between the heat dissipation pad 15 and the shielding cover 13, and between the shielding cover 13 and the heat pipe 14, and such heat resistance results in a certain degree of reduction, such as a temperature difference of 20 degrees Celsius, so as to cause the reduction of heat dissipation efficiency.

SUMMARY OF THE APPLICATION

The application is directed to an electronic assembly configured to increase the efficiency of heat pipe in dissipating heat generated by heat-generating elements.

The application is directed to an electronic device configured to increase the efficiency of heat pipe in dissipating heat generated by heat-generating elements.

The application provides an electronic assembly, including a circuit board, a heat-generating element, and a heat pipe. The heat-generating element includes a bottom surface and a side surface connected to the bottom surface. The heat-generating element is disposed on the circuit board via the bottom surface. The heat pipe is thermally coupled to the side surface of the heat-generating element to absorb heat from the heat-generating element.

The application provides an electronic device, including a casing, a display, and an electronic assembly. The display is disposed on the casing. The electronic assembly is disposed in the casing. The electronic assembly includes a circuit board, a heat-generating element, and a heat pipe. The heat-generating element includes a bottom surface and a side surface connected to the bottom surface. The heat-generating element is disposed on the circuit board via the bottom surface. The heat pipe is thermally coupled to the side surface of the heat-generating element to absorb heat from the heat-generating element.

As described above, in comparison to the conventional element stacked way strictly limiting the thickness of the heat pipe, in the application, the heat-generating element is disposed on the circuit board with its side surface thermally coupled to the heat pipe, thereby relaxing the limitation on the thickness of the heat pipe, and thus allowing the efficiency of the heat pipe to increase.

In order to make the aforementioned features and advantages of the application more comprehensible, embodiments accompanying figures are described in detail below.

DESCRIPTION OF THE EMBODIMENTS

Figure 1:
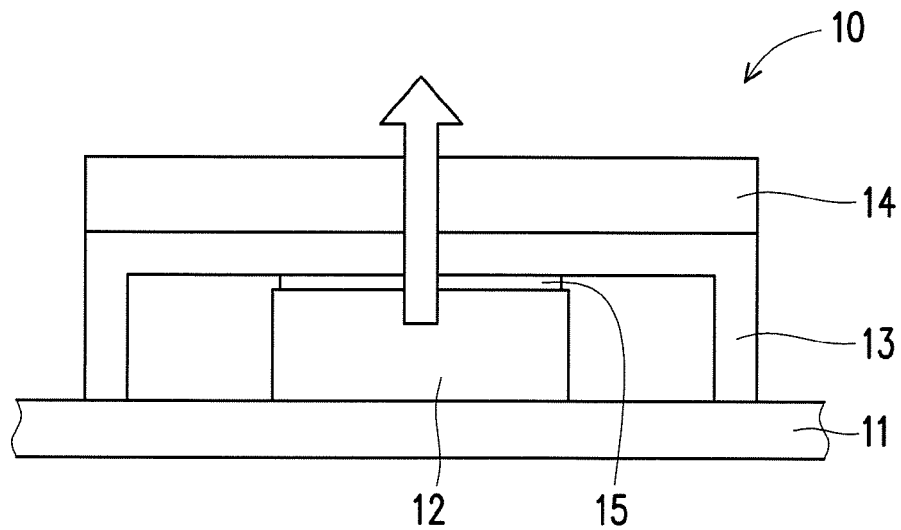
FIG. 1 is a cross-sectional view of a conventional electronic device.
Figure 2:
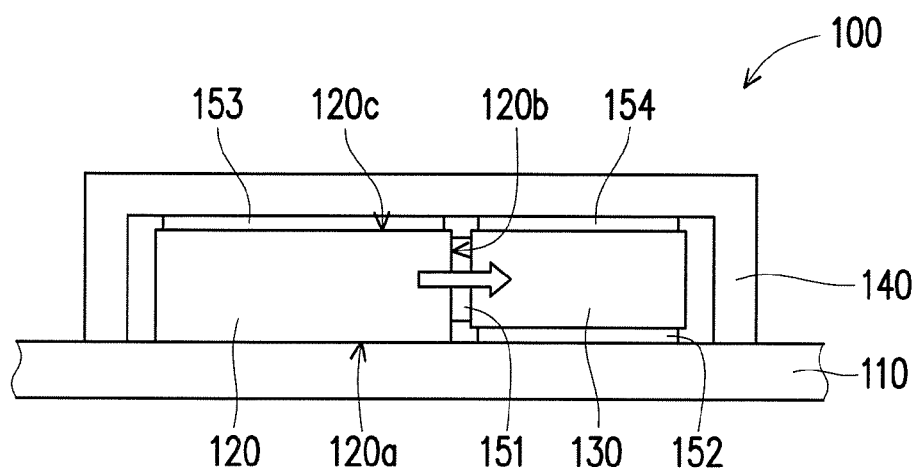
FIG. 2 is a cross-sectional view of an electronic assembly according to an embodiment of the application.

FIG. 2 is cross-sectional view of an electronic assembly according to an embodiment of the application. Referring to FIG. 2, in the present embodiment, an electronic assembly 100 may be used in an electronic device, more particularly a miniaturized electronic device such as a smart phone, a tablet, etc. The electronic assembly 100 includes a circuit board 110, a heat-generating element 120, and a heat pipe 130. The circuit board 110 may be a motherboard, a module board, etc. The heat-generating element 120 is an element generating heat, raising the temperature itself during operation and requiring cooling, such as a central processing unit (CPU), a graphic processing unit (GPU), a charging IC, a power chock, or an amplifier circuit (RFPA), but the application is not limited thereto. The heat-generating element 120 includes a bottom surface 120a and a side surface 120b which is connected to the bottom surface 120a. The heat-generating element 120 is mounted on the circuit board 110 via the bottom surface 120a. The heat pipe 130 is thermally coupled to the side surface 120b of the heat-generating element 120 to absorb heat from the heat-generating element 120. The heat pipe 130 rapidly transfers heat by using its internal medium through the transition process of evaporation at the evaporating end thereof followed by condensation at the condensation end. In comparison to a conventional electrical assembly (such as the electronic assembly in FIG. 1) which applies a structure of elements stacked on the circuit board, in the present embodiment, the electronic assembly 100 applies a structure of elements placed side by side on the circuit board 110 such that the heat pipe 130 may be thermally coupled to the side surface 120b of the heat-generating element 120, therefore relaxing the limitation on thickness of the heat pipe 130 and allowing the efficiency of the heat pipe 130 to be increased.

In the present embodiment, the electronic assembly 100 may further include a first thermal conductive layer 151. The first thermal conductive layer 151 is disposed between the side surface 120b of the heat-generating element 120 and the heat pipe 130, such that the heat-generating element 120 is thermally coupled to the heat pipe 130 through the first thermal conductive layer 151 and transfers heat of the heat-generating element 120 to the heat pipe 130. The first thermal conductive layer 151 can be a heat dissipation pad, a phase change material (PCM) layer or other high heat conductivity material layer. Additionally, the electronic assembly 100 may further include a second thermal conductive layer 152. The second thermal conductive layer 152 is disposed between the circuit board 110 and the heat pipe 130, such that the circuit board 110 may be thermally coupled to the heat pipe 130 through the second thermal conductive layer 152, so as to transfer heat from the circuit board 110 to heat pipe 130. The second thermal conductive layer 152 can be a heat dissipation pad, a phase change material (PCM) layer or other high thermal conductivity material layer.

To prevent electromagnetic interference (EMI) from affecting certain types of the heat-generating element 120, in the present embodiment, the electronic assembly 100 further includes a shielding cover 140. The shielding cover 140 is mounted on the circuit board 110 and is around the heat-generating element 120 with the heat pipe 130. The shielding cover 140 is usually made of metal, and thus has good thermal conductivity. As a result, the heat-generating element 120 may be thermally coupled to the shielding cover 140, allowing the shielding cover 140 to provide auxiliary heat dissipation. The heat-generating element 120 has a top surface 120c connected to the side surface 120b, and the heat-generating element 120 may be thermally coupled to the shielding cover 140 via the top surface 120c. In comparison to a conventional electrical assembly (such as the electronic assembly in FIG. 1) which applies a structure of elements stacked on the circuit board, in the present embodiment, the electronic assembly 100 applies a structure of elements placed side by side on the circuit board 110 such that the heat pipe 120 may be thermally coupled to the side surface 120b of the heat-generating element 120, and thus relaxing the limitation on thickness of heat pipe 130, allowing the efficiency of heat pipe 130 to be increased.

In the present embodiment, the electronic assembly 100 may further include a third thermal conductive layer 153. The third thermal conductive layer 153 is disposed between the heat-generating element 120 and the shielding cover 140, such that the heat-generating element 120 is thermally coupled to the shielding cover 140 through the third thermal conductive layer 153 and transfers heat of the heat-generating element 120 to the shielding cover 140. The third thermal conductive layer 153 can be a heat dissipation pad, a phase change material (PCM) layer or other high heat conductivity material layer. Additionally, the heat pipe 130 may be thermally coupled to the shielding cover 140, thus allowing the heat generated by heat-generating element 120 to be transferred to the heat pipe 130 via the shielding cover 140. In the present embodiment, the electronic assembly 100 may further include a fourth thermal conductive layer 154. The fourth thermal conductive layer 154 is disposed between the heat pipe 130 and the shielding cover 140, and therefore the shielding cover is thermally coupled to the heat pipe 130 via the fourth thermal conductive layer 154 in order to transfer heat on the shielding cover 140 to the heat pipe 130. The fourth thermal conductive layer 154 can be a heat dissipation pad, a phase change material (PCM) layer or other high heat conductivity material layer.

Figure 3:
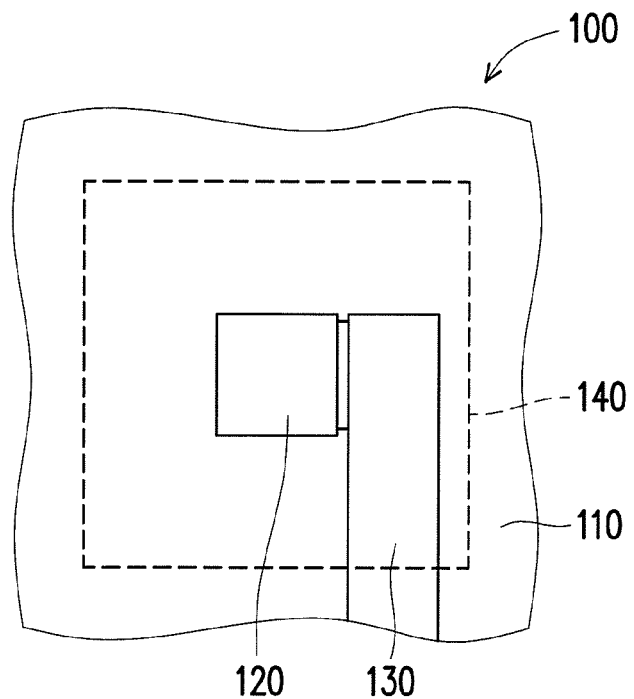
FIG. 3 is a top view of some of the elements of the electronic assembly in FIG. 2.
Figure 4:
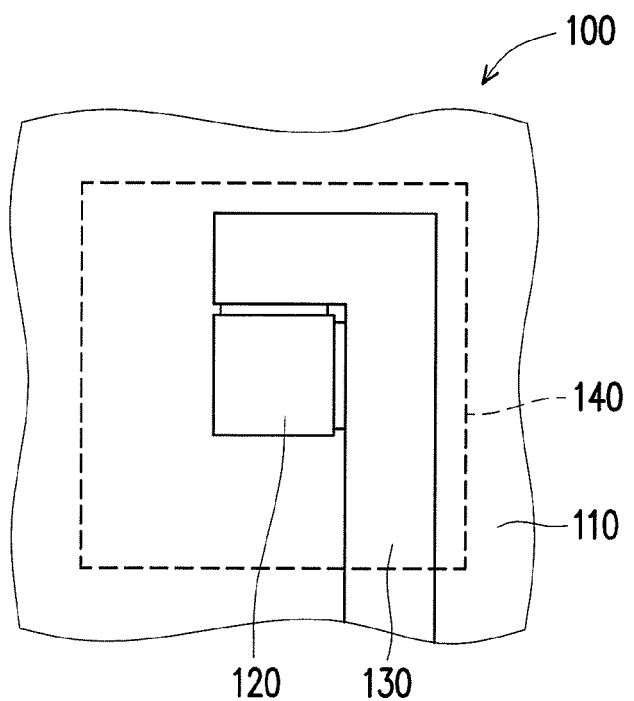
FIG. 4 is a top view of an electronic assembly according to another embodiment of the application.
Figure 5:
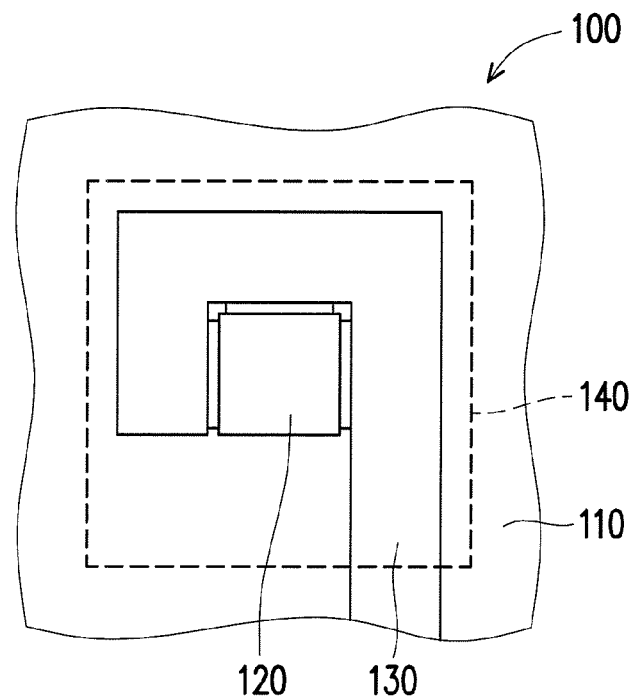
FIG. 5 is a top view of an electronic assembly according to another embodiment of the application.
Figure 6:
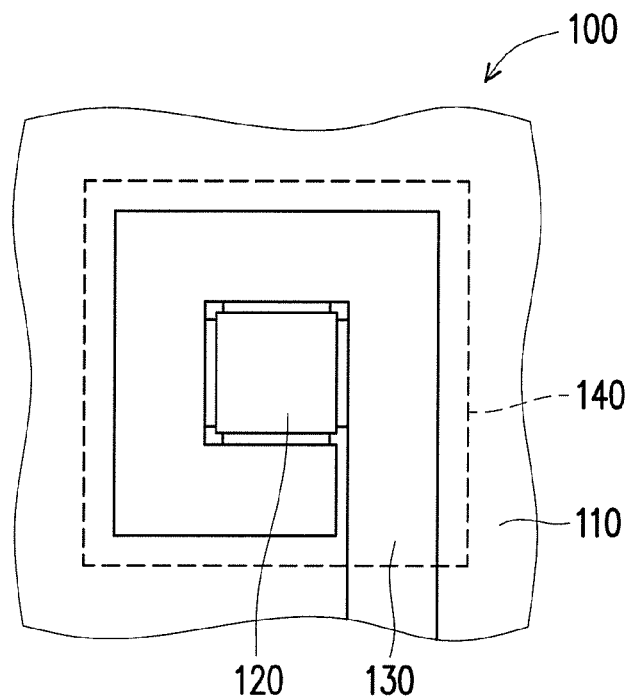
FIG. 6 is a top view of an electronic assembly according to another embodiment of the application.

FIG. 3 is a top view of some of the elements of an electronic assembly in FIG. 2. Referring to FIG. 3, in the present embodiment, the heat-generating element 120 is mounted on the circuit board 110, and the heat pipe 130 can be thermally coupled to a side surface of heat-generating element 120. FIG. 4 is a top view of an electronic assembly according to another embodiment of the application. Referring to FIG. 4, in another embodiment, the heat pipe 130 is capable of being thermally coupled to the two adjacent sides of the heat-generating element 120. FIG. 5 is a top view of an electronic assembly according to another embodiment of the application. Referring to FIG. 5, in another embodiment, the heat pipe 130 is capable of being thermally coupled to three adjacent sides of the heat-generating element 120. FIG. 6 is a top view of the electronic assembly according to another embodiment of the application. Referring to FIG. 6, in another embodiment, the heat pipe 130 is capable of being thermally coupled to the four adjacent sides of the heat-generating element 120, such that the heat pipe 130 surrounds the entire heat-generating element 120.

Figure 7:
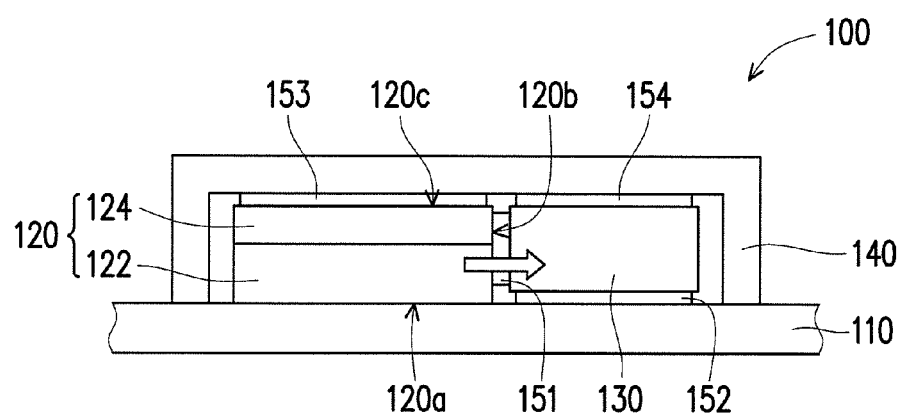
FIG. 7 is a cross-sectional view of an electronic assembly according to one embodiment of the application.

FIG. 7 is a cross-sectional view of an electronic assembly according to an embodiment of the application. Referring to FIG. 7, in the present embodiment, the heat-generating element 120 can includes a logic chip module 122 and a memory module 124, foaming a chipset. The logic chip module 122 is mounted on the circuit board 110, and the memory module 124 is stacked onto the logic chip module 122, such that the logic chip module 122 is located between the circuit board 110 and the memory module 124. The logic chip module 122, for example may be a central processing unit chip package, and the memory module 124, for example may be a multi-memory chip package, thus forming a stacked package structure of package on package (PoP) type. In comparison to the memory module 124, the logic chip module 122 is the main source of heat. The heat of logic chip module 122 can be directly transferred to the heat pipe 130 which is disposed on the side of the logic chip module, without going first through the memory module 124 and shielding cover 140 and then transferred to the heat pipe 130. As a result, good heat dissipation effect can be achieved.

Figure 8:
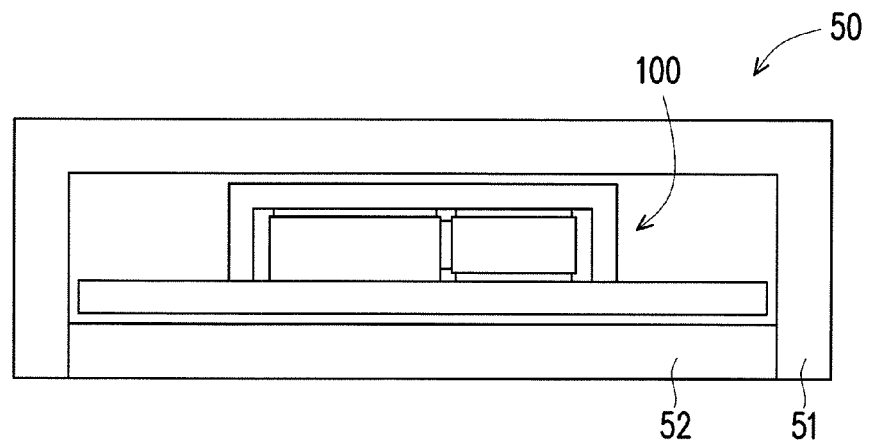
FIG. 8 is a cross-sectional view of an electronic device from another embodiment of the application.

FIG. 8 is a cross-sectional view of an electronic assembly according to another embodiment of the application. Referring to FIG. 8, in the present embodiment, an electronic device 50 may be a miniaturized electronic device such as a smart phone, a tablet etc. The electronic device 50 includes a casing 52, a display 54, and an electronic assembly identical or similar to the electronic assembly in FIG. 1. The display 54 is mounted on the casing 52, and the electronic assembly 100 is disposed in the casing 52. In the present embodiment, the display 54 may be a touch control display. The electronic device 100 may be similar or identical to that in FIG. 1, and additionally may be the electronic assembly 100 described in the other embodiments. As such, detailed descriptions of the electronic assembly 100 are provided in the above-described embodiments.

In summary, in comparison to a conventional element stacked way which strictly limits the thickness of the heat pipe, in the application, the heat-generating element is mounted on the circuit board and with its side surface thermally coupled to the heat pipe, thereby relaxing the limitation on the thickness of the heat pipe, and thus allowing the efficiency of the heat pipe to be increased.

In comparison to the conventional element stacked way which increases the heat resistance between the heat-generating element and the heat pipe, in the application, the heat pipe is thermally coupled to the side surface of the heat-generating element, and as a result the heat-generating element is thermally coupled to the heat pipe without going via the shielding cover, thereby reducing the heat resistance from the heat-generating element to the heat pipe, thus increasing the efficiency of the heat pipe.

In the application, when the heat-generating element includes a logic chip module and a memory module stacked in order, the heat on the logic chip module below the memory module can be transferred directly to the heat pipe disposed adjacent to the logic chip module without being transferred to the heat pipe via the memory module and the shield cover, and thus good heat dissipation can be achieved.

Although the application has been described with reference to the above embodiments, the application is not limited to the above embodiments. It is apparent to one of ordinary skill in the art that modifications and variations to the described embodiments may be made without departing from the spirit and scope of the application. Accordingly, the scope of the application will be defined by the attached claims.

What is claimed is:

1. An electronic assembly, comprising:
a circuit board;
a heat-generating element having a top surface, a bottom surface and at least two side surfaces, wherein the top surface is opposed to the bottom surface, each of the at least two side surfaces is connected to the top surface and the bottom surface, and the heat-generating element is mounted on the circuit board via the bottom surface; and
a heat pipe thermally coupled to at least one of the at least two side surfaces of the heat-generating element through a first thermal conductive layer to absorb heat from the heat-generating element,
wherein a thickness of the heat pipe is smaller than a thickness of the heat-generating element,
wherein the heat pipe is only disposed at the at least one of the at least two side surfaces of the heat-generating element through the first thermal conductive layer.

2. The electronic assembly of claim 1, further comprising:
a second thermal conductive layer disposed between the circuit board and the heat pipe.

3. The electronic assembly of claim 1, further comprising:
a shielding cover mounted on the circuit board and being around the heat-generating element with the heat pipe.

4. The electronic assembly of claim 3, wherein the heat-generating element is thermally coupled to the shielding cover.

5. The electronic assembly of claim 3, further comprising:
a third thermal conductive layer disposed between the heat-generating element and the shielding cover.

6. The electronic assembly of claim 3, wherein the heat pipe is thermally coupled to the shielding cover.

7. The electronic assembly of claim 6, further comprising:
a fourth thermal conductive layer disposed between the heat pipe and the shielding cover.

8. The electronic assembly of claim 1, wherein the heat-generating element comprises a central processing unit, a graphics processing unit, a charging IC, a power chock, or an amplifier circuit.

9. The electronic assembly of claim 1, wherein the heat-generating element comprises a logic chip module and a memory module, the logic chip module is mounted on the circuit board, and the memory module is stacked onto the logic chip module, such that the logic chip module is located between the circuit board and the memory module.

10. An electronic device, comprising:
a casing;
a display mounted on the casing; and
an electronic assembly disposed in the casing, the electronic assembly comprising:
a circuit board;
a heat-generating element comprising a top surface, a bottom surface and at least two side surfaces, wherein the top surface is opposed to the bottom surface, each of the at least two side surfaces is connected to the top surface and the bottom surface, and the heat-generating element is mounted on the circuit board via the bottom surface; and
a heat pipe thermally coupled to at least one of the at least two side surfaces of the heat-generating element through a first thermal conductive layer to absorb heat from the heat-generating element,
wherein a thickness of the heat pipe is smaller than a thickness of the heat-generating element,
wherein the heat pipe is only disposed at the at least one of the at least two side surfaces of the heat-generating element through the first thermal conductive layer.

11. The electronic device of claim 10, wherein the electronic assembly further comprises:
a second thermal conductive layer disposed between the circuit board and the heat pipe.

12. The electronic device of claim 10, wherein the electronic assembly further comprises:
a shielding cover mounted on the circuit board and being around the heat-generating element with the heat pipe.

13. The electronic device of claim 12, wherein the heat-generating element is thermally coupled to the shielding cover.

14. The electronic device of claim 12, wherein the electronic assembly further comprises:
a third thermal conductive layer disposed between the heat-generating element and the shielding cover.

15. The electronic device of claim 12, wherein the heat pipe is thermally coupled to the shielding cover.

16. The electronic device of claim 15, wherein the electronic assembly further comprises:
a fourth thermal conductive layer disposed between the heat pipe and the shielding cover.

17. The electronic device of claim 10, wherein the heat-generating element comprises a central processing unit, a graphics processing unit, a charging IC, a power chock, or an amplifier circuit.

18. The electronic device of claim 10, wherein the heat-generating element comprises a logic chip module and a memory module, the logic chip module is mounted on the circuit board, and the memory module is stacked onto the logic chip module, such that the logic chip module is located between the circuit board and the memory module.

* * * * *